United States Patent
Lyons

(10) Patent No.: US 6,319,843 B1
(45) Date of Patent: Nov. 20, 2001

(54) NITRIDE SURFACE PASSIVATION FOR ACID CATALYZED CHEMICALLY AMPLIFIED RESIST PROCESSING

(75) Inventor: Christopher F. Lyons, Fremont, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/328,084

(22) Filed: Jun. 8, 1999

(51) Int. Cl.[7] .................................................. H01L 21/302
(52) U.S. Cl. ............................................ 438/724; 438/788
(58) Field of Search ................................. 427/576, 579, 427/539; 430/317; 438/724, 788, FOR 389, FOR 401

(56) References Cited

U.S. PATENT DOCUMENTS

| | | |
|---|---|---|
| 5,059,450 | * 10/1991 | Mellul et al. . |
| 5,169,791 | 12/1992 | Muenzer ................................. 437/13 |
| 5,486,267 | * 1/1996 | Knight et al. . |
| 5,561,319 | 10/1996 | Owens et al. ......................... 257/649 |
| 5,599,739 | 2/1997 | Merchant et al. .................... 437/190 |
| 5,633,202 | 5/1997 | Brigham et al. ...................... 438/763 |
| 5,641,546 | 6/1997 | Elwell et al. ......................... 427/575 |
| 5,667,879 | 9/1997 | Haji-Sheikh ......................... 428/209 |
| 5,716,888 | 2/1998 | Lur et al. ............................. 438/619 |
| 5,723,368 | 3/1998 | Cho et al. ............................ 437/763 |
| 5,792,702 | 8/1998 | Liang ................................... 438/624 |
| 6,060,213 | * 5/2000 | Kodama . |

FOREIGN PATENT DOCUMENTS

3120402-B2 * 12/2000 (JP) .

* cited by examiner

Primary Examiner—George Fourson
Assistant Examiner—Michelle Estrada
(74) Attorney, Agent, or Firm—Renner, Otto, Boisselle & Sklar, LLP

(57) ABSTRACT

In one embodiment, the present invention relates to a method of minimizing or preventing contamination of an acid catalyzed photoresist when using the acid catalyzed photoresist over a nitride containing film, involving contacting the nitride containing film with an oxidizing plasma comprising from about 1% to about 90% by volume of an oxygen containing gas and from about 10% to about 99% by volume of a forming gas prior to deposition of the acid catalyzed photoresist over the nitride containing film.

17 Claims, 1 Drawing Sheet

NITRIDE SURFACE PASSIVATION FOR ACID CATALYZED CHEMICALLY AMPLIFIED RESIST PROCESSING

TECHNICAL FIELD

The present invention generally relates to improved photolithographic methods. In particular, the present invention relates to treating nitride surfaces to prevent poisoning of acid catalyzed photoresists.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. Attempts made to improve lithography include advances made in developing new photoresists. For example, so-called deep UV (ultra-violet) photoresists take advantage of improved resolution associated with the relatively short wavelength of light used to expose the deep UV photoresists prior to development. However, some deep UV photoresists are made of acid catalyzed or chemically amplified photoresist materials. This is a concern because problems occur in many instances when using an acid catalyzed photoresist material over a nitride layer.

In particular, acid catalyzed photoresist materials are deleteriously affected or poisoned by nitride layers. Although not completely understood, it is believed that nitrogen atoms from the nitride layer poison a thin portion of the acid catalyzed photoresist material adjacent the nitride layer. More particularly, it is believed that nitrogen atoms at the interface of the nitride layer and the acid catalyzed photoresist act as a Lewis base neutralizing the photogenerated acid preventing chemical change (acid catalysis) within the photoresist following exposure to actinic radiation. Thus, the acid catalyzed photoresist is contaminated as a thin desensitized layer is formed within the photoresist (adjacent the nitride layer) that prevents or deforms subsequent pattern formation of the photoresist.

Referring to FIG. 1, the profile of a poorly developed acid catalyzed photoresist 12 is illustrated. The poorly developed photoresist 12 is formed over a silicon nitride layer 10. This particular poorly developed photoresist 12 exhibits footing, wherein a portion 14 of the developed photoresist is deformed, presumably due to desensitization or acid quenching from the top surface of the silicon nitride layer 10. It is noted that even poorly developed photoresist 12 is difficult to obtain on the top surface of the silicon nitride layer 10, as in many instances development is impossible.

Procedures that increase resolution, improved critical dimension control, and provide small conductive features are desired. These procedures include those that enable the use of high resolution acid catalyzed photoresist materials.

SUMMARY OF THE INVENTION

The present invention provides methods of using acid catalyzed photoresist materials. The present invention also provides methods of treating nitride surfaces to prevent poisoning of acid catalyzed photoresists. As a result, the present invention effectively addresses the concerns raised by the trend towards the miniaturization of semiconductor devices by facilitating the use of high resolution acid catalyzed photoresists.

In one embodiment, the present invention relates to a method of minimizing or preventing contamination of an acid catalyzed photoresist when using the acid catalyzed photoresist over a nitride containing film, involving contacting the nitride containing film with an oxidizing plasma comprising from about 1% to about 90% by volume of an oxygen containing gas and from about 10% to about 99% by volume of a forming gas prior to deposition of the acid catalyzed photoresist over the nitride containing film.

In another embodiment, the present invention relates to a method of processing a semiconductor substrate having a nitride containing film over at least a portion thereof, involving the steps of providing the semiconductor substrate having the nitride containing film over at least a portion thereof; contacting the nitride containing film with an oxidizing plasma comprising an oxygen containing gas and a forming gas; and depositing an acid catalyzed photoresist over at least a portion of the nitride containing film.

In yet another embodiment, the present invention relates to a method of forming a crisp, well defined developed photoresist pattern over a nitride containing film using an acid catalyzed photoresist, involving the steps of providing the nitride containing film; contacting the nitride containing film with an oxidizing plasma comprising from about 5% to about 70% by volume of an oxygen containing gas and from about 30% to about 95% by volume of a forming gas comprising hydrogen and nitrogen; depositing the acid catalyzed photoresist over at least a portion of the nitride containing film; irradiating the acid catalyzed photoresist with actinic radiation; and developing the irradiated acid catalyzed photoresist thereby providing the crisp, well defined developed photoresist pattern.

DISCLOSURE OF INVENTION

Figure 1:
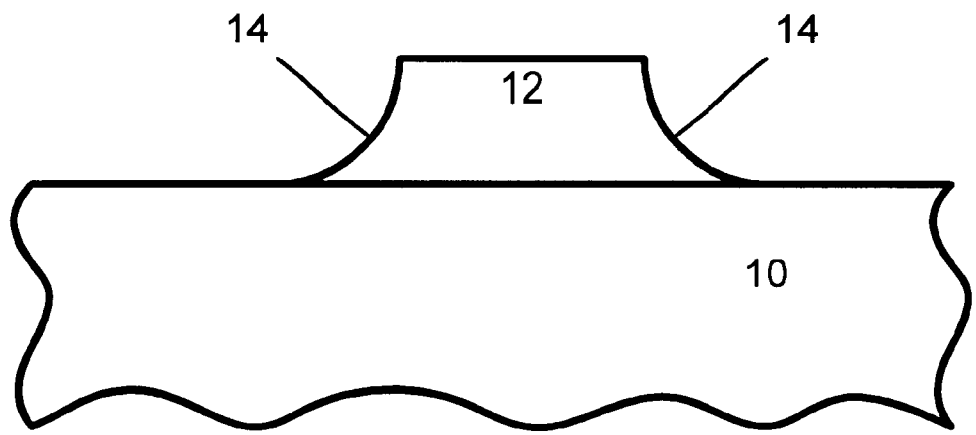
FIG. 1 is a cross-sectional view illustrating the profile of a developed acid catalyzed photoresist over a conventional nitride containing surface.

The present invention involves treating nitride surfaces to facilitate the use of acid catalyzed deep UV photoresist materials. The present invention more specifically involves contacting a nitride surface with an oxidizing plasma prior to application of an acid catalyzed deep UV photoresist material thereto. As a result of the contact with an oxidizing plasma, the nitride surface is passivated preventing, minimizing or controlling poisoning (contamination) of an acid catalyzed deep UV photoresist material applied thereover.

The nitride surface is the top surface of a nitride containing film. The nitride containing film is provided over at least a portion of a semiconductor substrate. In one embodiment, the nitride containing film is provided over the entire semiconductor substrate. In another embodiment, the nitride containing film is provided over a portion of the semiconductor substrate where other portions of the substrate, such as conductive or insulating films and/or devices are exposed or partially exposed. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Examples of nitride containing films include nitrogen rich films such as silicon nitride, nitrogen rich silicon oxynitride, titanium nitride, tantalum nitride, and tungsten nitride. The nitride containing film is formed over the semiconductor substrate in any suitable manner, including CVD techniques. CVD techniques include low pressure chemical vapor deposition (LPCVD) and plasma enhanced chemical vapor deposition (PECVD). For example, a silicon nitride film may be made by PECVD or LPCVD employing gases containing silicon and nitrogen, such as using $SiH_4$ or $SiCl_2H_2$ and $N_2$ or $NH_3$. In one embodiment, the nitride containing film is a silicon nitride layer made by LPCVD techniques employing $SiCl_2H_2$ and $NH_3$. In another embodiment, the nitride containing film is a silicon nitride layer made by PECVD techniques employing $SiH_4$ and $NH_3$. In yet another embodiment, the nitride containing film is a nitride rich silicon oxynitride layer made by PECVD or LPCVD employing $SiH_4$ and $N_2O$ and $NH_3$.

The thickness of the nitride containing film is not critical to the present invention. In one embodiment, however, the nitride containing film has a thickness from about 100 Å to about 30,000 Å. In another embodiment, the nitrogen rich nitride containing film has a thickness from about 500 Å to about 20,000 Å. In yet another embodiment, the nitride containing film has a thickness from about 1,000 Å to about 10,000 Å.

Prior deposition of an acid catalyzed photoresist over the nitride containing film, the nitride containing film is contacted with an oxidizing plasma. Standard ashing equipment or other suitable semiconductor processing equipment may be used for exposing the nitride containing film to the oxidizing plasma in accordance with the parameters set forth below. The oxidizing plasma contains at least two components; namely, an oxygen containing gas and a forming gas. Oxygen containing gases are gases that include at least one atom of oxygen, such as $O_2$, $O_3$, $H_2O$, and $N_2O$, although $O_2$ is preferred. In one embodiment, the oxidizing plasma contains from about 1% to about 90% by volume of an oxygen containing gas. In another embodiment, the oxidizing plasma contains from about 5% to about 70% by volume of an oxygen containing gas. In yet another embodiment, the oxidizing plasma contains from about 10% to about 60% by volume of an oxygen containing gas.

A forming gas contains a mixture of hydrogen and nitrogen ($H_2$ and $N_2$). In one embodiment, the forming gas contains a mixture of about 0.1% to about 50% by volume of hydrogen and about 50% to about 99.9% by volume of nitrogen. In another embodiment, the forming gas contains a mixture of about 1% to about 25% by volume of hydrogen and about 75% to about 99% by volume of nitrogen. In yet another embodiment, the forming gas contains a mixture of about 2% to about 10% by volume of hydrogen and about 90% to about 98% by volume of nitrogen. In one embodiment, the oxidizing plasma contains from about 10% to about 99% by volume of a forming gas. In another embodiment, the oxidizing plasma contains from about 30% to about 95% by volume of a forming gas. In yet another embodiment, the oxidizing plasma contains from about 40% to about 90% by volume of a forming gas.

In one optional embodiment, the oxidizing plasma further contains an inert gas or carrier gas. Inert gases generally include one or more of the noble gases. Nobles gases include He, Ne, Ar, Kr, and Xe. When present, the oxidizing plasma contains from about 1% to about 99% by volume of an inert gas or carrier gas. In another optional embodiment, the oxidizing plasma contains from about 5% to about 90% by volume of an inert gas or carrier gas. In yet another optional embodiment, the oxidizing plasma contains from about 10% to about 80% by volume of an inert gas or carrier gas.

The nitride containing film is contacted with an oxidizing plasma under a pressure sufficient to facilitate passivation of the top surface of the nitride containing film. In one embodiment, the pressure is from about 10 mtorr to about 2,000 torr. In another embodiment, the pressure is from about 100 mtorr to about 800 torr. In yet another embodiment, the pressure is from about 500 mtorr to about 500 torr.

The nitride containing film-contacted with an oxidizing plasma under a temperature a sufficient to facilitate passivation of the top surface of the nitride containing film. In one embodiment, the temperature is from about 100° C. to about 1,000° C. In another embodiment, the temperature is from about 200° C. to about 800° C. In yet another embodiment, the temperature is from about 250° C. to about 600° C.

The nitride containing film is contacted with an oxidizing plasma for a time sufficient to facilitate passivation of the top surface of the nitride containing film. In one embodiment, the contact time is from about 0.1 seconds to about 30 minutes. In another embodiment, the contact time is from about 1 second to about 5 minutes. In yet another embodiment, the contact time is from about 5 seconds to about 1 minute.

The nitride containing film is contacted with an oxidizing plasma under a power sufficient to facilitate passivation of the top surface of the nitride containing film. In one embodiment, the power is from about 10 Watts to about 1,000 Watts. In another embodiment, the power is from about 50 Watts to about 750 Watts. In yet another embodiment, the power is from about 100 Watts to about 500 Watts.

Although various ranges of conditions are described above, it is understood by those skilled in the art that raising or lowering one parameter will necessary require a raising or lowering of one or more other parameters. In this connection, the parameters are interrelated, and one skilled in the art can determine, given the guidelines provided above, particular conditions that facilitate passivation of the top surface of the nitride containing film by contact with an oxidizing plasma in accordance with the present invention.

Optionally, after the nitride containing film is contacted with an oxidizing plasma and prior to application of an acid catalyzed photoresist, the surface of the nitride containing film and the substrate surface (in embodiments where the nitride containing film does cover the entire substrate surface) may be subjected to a cleaning treatment. Any suitable cleaning treatment may be employed so long as the passivated surface of the nitride containing film is not degraded or destroyed.

An acid catalyzed photoresist is deposited over the nitride containing film. The acid catalyzed photoresist contains a resin material that undergoes a chemical change upon exposure to actinic radiation. Particularly, an acid catalyzed resin material contains a photoacid generator that generates an acid upon exposure to activating-radiation. Photoacid generating compounds include aromatic substituted halohydrocarbons (such as 1,1-bis(p-chlorophenyl)-2,2,2-trichloroethane), halo-substituted sulfur containing compounds, haloheterocyclic compounds, onium salts (such as diaryl diazonium salts), sulfonated esters, and sulfonated ketones. In one embodiment, the acid catalyzed resin material is a chemically amplified photoresist material.

Any suitable wavelength of radiation may be employed to expose the photoresist so long as an acid catalyzed resin material is used. For example, radiation having wavelengths from about 1 nm to about 500 nm may be employed. In a preferred embodiment, radiation having wavelengths from about 1 nm to about 250 nm may be employed. Acid catalyzed resin photoresists may include a 157 nm sensitive photoresist, a 193 nm sensitive photoresist, an I-line, H-line, G-line, E-line, mid UV, deep UV or an extreme UV photoresist material. Deep UV acid catalyzed photoresists are preferred. Photoresists are commercially available from a number of sources, including Shipley Company, Kodak, Hoechst Celanese Corporation, and Brewer. A specific example of a deep UV acid catalyzed photoresist is a combination of a partially t-butoxycarbonyloxy substituted poly-p-hydroxystyrene and a photoacid generator.

The acid catalyzed photoresist may be deposited using any suitable means on the nitride containing film. For example, the acid catalyzed photoresist may be spin-coated on the nitride containing film (and other exposed areas of the semiconductor substrate in embodiments where the nitride containing film does cover the entire substrate surface).

The acid catalyzed photoresist is applied to any suitable thickness as the thickness is not critical to the invention. In one embodiment, the acid catalyzed photoresist is applied to a thickness from about 200 Å to about 20,000 Å. In another embodiment, the acid catalyzed photoresist is applied to a thickness from about 500 Å to about 10,000 Å. In yet another embodiment, the acid catalyzed photoresist is applied to a thickness from about 1,000 Å to about 5,000 Å.

The semiconductor substrate containing a nitride containing film having an acid catalyzed photoresist is then subjected to suitable photolithographic processing including irradiation by actinic radiation, development into a pattern, further substrate processing (typically etching or deposition steps), and photoresist stripping. Since the surface of the nitride containing film is passivated in accordance with the present invention, crisp, well defined patterned photoresists are obtainable.

Figure 2:
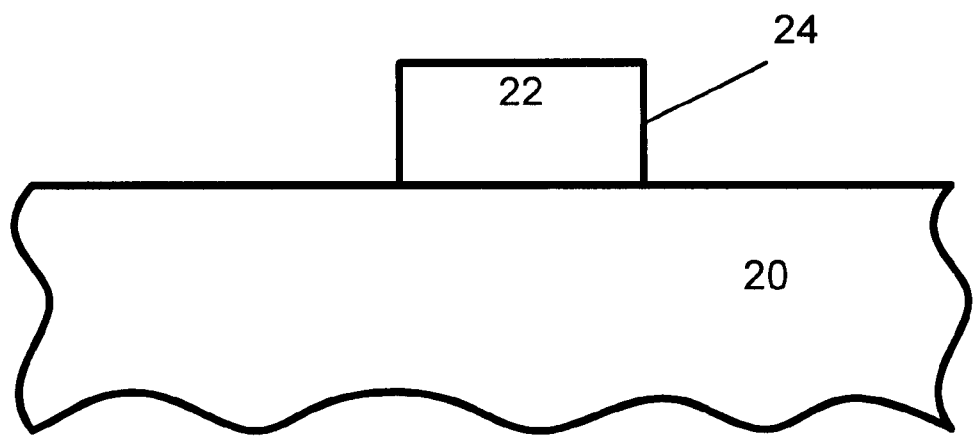
FIG. 2 is a cross-sectional view illustrating the profile of a developed acid catalyzed photoresist over a nitride containing surface according to one embodiment of the present invention.

Referring to FIG. 2, a cross-sectional view illustrating the profile of a developed acid catalyzed photoresist over an oxidizing plasma treated nitride containing surface according to one embodiment of the present invention is shown. In particular, the nitride containing film 20 has a developed acid catalyzed photoresist 22 thereover. Footing is not exhibited, even at portions 24 of the developed acid catalyzed photoresist 22 near the nitride containing film 20 surface, deformation is not exhibited. Instead, a crisp, well defined patterned acid catalyzed photoresist 22 is shown. This is in contrast to the profile of a developed acid catalyzed photoresist over a conventional nitride containing surface illustrated in FIG. 1.

While the acid catalyzed photoresist is in contact with the nitride containing film, chemical interactions within the portions of the photoresist adjacent the nitride containing film are prevented or minimized due to contact of the nitride containing film with the oxidizing plasma. As a result, the formation of a thin desensitized resist layer within the acid catalyzed photoresist is prevented or minimized. Although not wishing to be bound by any theory, it is believed that the oxidizing plasma at least one of removes free nitrogen atoms from the surface of the nitride containing film, oxidizes nitrogen atoms forming a thin oxide coating on the surface of the nitride containing film, or deactivates the nitrogen atoms on the surface of the nitride containing film. Consequently, nitrogen atoms from the nitride containing film do not poison or do not substantially poison a thin portion of the acid catalyzed photoresist adjacent the nitride containing film.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of minimizing or preventing contamination of an acid catalyzed photoresist when using the acid catalyzed photoresist over a nitride containing film, comprising:

contacting the nitride containing film with an oxidizing plasma comprising from about 1% to about 90% by volume of an oxygen containing gas and from about 10% to about 99% by volume of a forming gas prior to deposition of the acid catalyzed photoresist over the nitride containing film, wherein the nitride containing film comprises at least one of silicon nitride, nitrogen rich silicon oxynitride, titanium nitride, tantalum nitride, and tungsten nitride, and the forming gas comprises hydrogen and nitrogen.

2. The method of claim 1, wherein the oxidizing plasma comprises from about 5% to about 70% by volume of the oxygen containing gas and from about 30% to about 95% by volume of the forming gas.

3. The method of claim 1, wherein the oxidizing plasma further comprises from about 5% to about 90% by volume of an inert or carrier gas.

4. The method of claim 1, wherein the nitride containing film is contacted with the oxidizing plasma under a pressure from about 10 mtorr to about 2,000 torr, a temperature from about 100° C. to about 1,000° C., and a power from about 10 Watts to about 1,000 Watts for a time from about 0.1 seconds to about 30 minutes.

5. The method of claim 1, wherein the acid catalyzed photoresist is a deep ultraviolet photoresist material.

6. A method of processing a semiconductor substrate having a nitride containing film over at least a portion thereof, comprising:

providing the semiconductor substrate having the nitride containing film over at least a portion thereof;

contacting the nitride containing film with an oxidizing plasma comprising an oxygen containing gas and a forming gas; and depositing an acid catalyzed photoresist over at least a portion of the nitride containing film, wherein the nitride containing film comprises at least one of silicon nitride, nitrogen rich silicon oxynitride, titanium nitride, tantalum nitride, and tungsten nitride, and the forming gas comprises hydrogen and nitrogen.

7. The method of claim 6, wherein the oxidizing plasma comprises from about 1% to about 90% by volume of the oxygen containing gas and from about 10% to about 99% by volume of the forming gas.

8. The method of claim 6, wherein the oxidizing plasma comprises from about 10% to about 60% by volume of the oxygen containing gas and from about 40% to about 90% by volume of the forming gas.

9. The method of claim 6, wherein the forming gas comprises from about 0.1% to about 50% by volume of hydrogen and from about 50% to about 99.9% by volume of nitrogen.

10. The method of claim 6, wherein the nitride containing film is contacted with the oxidizing plasma under a pressure from about 100 mtorr to about 800 torr, a temperature from about 200° C. to about 800° C., and a power from about 50 Watts to about 750 Watts for a time from about 1 second to about 5 minutes.

11. The method of claim 6, the oxidizing plasma further comprises from about 10% to about 80% by volume of at least one of He, Ne, Ar, Kr, and Xe.

12. The method of claim 6, wherein the acid catalyzed photoresist is at least one of a mid ultraviolet photoresist material, a deep ultraviolet photoresist material, and an extreme ultraviolet photoresist material.

13. A method of forming a crisp, well defined developed photoresist pattern over a nitride containing film using an acid catalyzed photoresist, comprising:

providing the nitride containing film;

contacting the nitride containing film with an oxidizing plasma comprising from about 5% to about 70% by volume of an oxygen containing gas and from about 30% to about 95% by volume of a forming gas comprising hydrogen and nitrogen;

depositing the acid catalyzed photoresist over at least a portion of the nitride containing film;

irradiating the acid catalyzed photoresist with actinic radiation; and developing the irradiated acid catalyzed photoresist thereby providing the crisp, well defined developed photoresist pattern, wherein the nitride containing film comprises at least one of silicon nitride, nitrogen rich silicon oxynitride, titanium nitride, tantalum nitride, and tungsten nitride, and the forming gas comprises hydrogen and nitrogen.

14. The method of claim 13, wherein the oxygen containing gas comprises $O_2$.

15. The method of claim 13, wherein the nitride containing film is contacted with the oxidizing plasma under a pressure from about 500 mtorr to about 500 torr, a temperature from about 250° C. to about 600° C., and a power from about 100 Watts to about 500 Watts for a time from about 5 seconds to about 1 minute.

16. The method of claim 13, wherein the actinic radiation comprises light having at least one wavelength from about 1 nm to about 500 nm.

17. The method of claim 13, wherein the acid catalyzed photoresist comprises a partially t-butoxycarbonyloxy substituted poly-p-hydroxystyrene and a photoacid generator.

* * * * *